United States Patent
Gao et al.

(10) Patent No.: US 8,704,344 B2
(45) Date of Patent: Apr. 22, 2014

(54) ULTRA-SMALL CHIP PACKAGE AND METHOD FOR MANUFACTURING THE SAME

(71) Applicant: Diodes Incorporated, Plano, TX (US)

(72) Inventors: Hongtao Gao, Shanghai (CN); Jiang Yuan Zhang, SuZhou (CN)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 13/647,180

(22) Filed: Oct. 8, 2012

(65) Prior Publication Data

US 2013/0147029 A1  Jun. 13, 2013

(51) Int. Cl.
*H01L 23/498* (2006.01)

(52) U.S. Cl.
USPC ..... 257/666; 257/676; 257/735; 257/E23.088

(58) Field of Classification Search
USPC .......................... 257/735, 666, 676, E23.068
See application file for complete search history.

(56) References Cited

U.S. PATENT DOCUMENTS 6,040,626 A * 3/2000 Cheah et al. ................. 257/735

* cited by examiner

*Primary Examiner* — Roy Potter

(57) ABSTRACT

Some embodiments of the present disclosure provide the design and manufacture of an ultra-small chip assembly. The ultra-small chip assembly comprises a die, a plate-like back electrode disposed on the back-side of the die, and one or more plate-like positive electrodes disposed on the front-side of the die. The ultra-small chip assembly is configured such that one end of the plate-like back electrode extends beyond a first side of the die, and each of the one or more plate-like positive electrodes includes an end which extends beyond a second side of the die. By attaching both the plate-like back electrode and the plate-like positive electrodes on the surfaces of the die, and directly using the exposed ends of the plate-like electrodes as the lead-out electrodes for the chip assembly, the electrical connections outside of the die only occupy a very small volume.

10 Claims, 7 Drawing Sheets

CHIP PACKAGE 100

ULTRA-SMALL CHIP PACKAGE AND METHOD FOR MANUFACTURING THE SAME

RELATED APPLICATION

This application claims priority under 35 U.S.C. section 119 to Chinese patent application having Application No. 201110401556.8, Publication Serial No. 2011120700615930, entitled "AN ULTRA-SMALL CHIP PACKAGE AND METHOD FOR MANUFACTURING THE SAME," filed on Dec. 7, 2011, the contents of which are hereby incorporated by reference in their entirety.

BACKGROUND

1. Field

This disclosure generally relates to the field of semiconductor device packaging. More specifically, this disclosure relates to an ultra-small chip assembly and method for manufacturing an ultra-small chip assembly.

2. Related Art

As semiconductor devices continue to shrink in size, in order to reduce the overall device size after packaging, it is necessary to increase the volume ratio that is shared by chips in the package.

In traditional semiconductor devices, the chip or die is first affixed onto a support platform of the lead-wire frame of the chip package, and a set of electrodes on the die are then connected to a separate wire-bonding platform by lead wires. In such designs, the wire-bonding platform and the support platform of the lead-wire frame typically account for a lot of volume within the chip package. As a result, the volume ratio of the die within the chip package cannot be too high. These factors have hampered the miniaturization development trend of semiconductor devices. For example, FIG. 1 presents a diagram illustrating an existing ultra-small "QFN" chip package 100, which comprises a die 110, a lead frame 120, and a lead pin 130. A typical package size of such a structure is 0.62 mm×0.32 mm, but the size of die 100 itself is 0.2 mm×0.2 mm. In this design, a majority of the package volume is occupied by lead frame 120 and lead pin 130, while die 110 occupies only about 20% of the area. As the size of die 110 continues to decrease, the aforementioned ratio will be reduced further, due to the fact that the reduction in size of lead frame 120 and lead pin 130 is limited, but their portion of volume ratio will increase.

SUMMARY

Throughout the specification, the terms "chip" and "die" are used interchangeably. Moreover, the terms "package" and "assembly" are also used interchangeably.

Some embodiments of the present disclosure provide the design and manufacture of an ultra-small chip assembly which facilitates increasing the volume ratio of the die within the assembly, thereby decreasing the volume of the assembly. In particular embodiments, the ultra-small chip assembly comprises a die, a plate-like back electrode disposed on the back-side of the die, and one or more plate-like positive electrodes disposed on the front-side of the die. The ultra-small chip assembly is configured such that one end of the plate-like back electrode extends beyond a first side of the die, and each of the one or more plate-like positive electrodes includes an end which extends beyond a second side of the die.

In some embodiments, the end of the back electrode which extends beyond the first side of the die, and the ends of the multiple positive electrodes which extend beyond the second side of the die are on the same side of the die.

In some embodiments, the second side of the die is opposite the first side of the die.

In some embodiments, the ultra-small chip assembly comprises a plastic encapsulation which encapsulates the die, the plate-like back electrode, and the one or more plate-like positive electrodes, wherein the plastic encapsulation is configured to expose both the end of the back electrode which extends beyond the first side of the die, and the ends of the multiple positive electrodes which extend beyond the second side of the die.

Some embodiments of the present disclosure also provide a technique for manufacturing the aforementioned ultra-small chip assembly. The process starts by receiving the plate-like back electrode, the one or more plate-like positive electrodes, and the die. The process then attaches the back-side of the die to the surface of the back electrode, so that the back-side of the die and the surface of the back electrode are electrically coupled, and an end of the back electrode extends beyond a first side of the die. Next, the process attaches the one or more positive electrodes to the front-side of the die, so that each of the one or more positive electrodes is electrically coupled to a corresponding bonding pad among one or more bonding pads on the front-side of the die in accordance with a predetermined design configuration, and each of the one or more positive electrodes includes an end extending beyond a second side of the die.

In some embodiments, attaching the one or more positive electrodes to the front-side of the die involves orienting the one or more positive electrodes on the die such that the end of the back electrode which extends beyond the first side of the die, and the ends of the one or more positive electrodes which extend beyond the second side of the die are on the same side of the die.

In some embodiments, attaching the one or more positive electrodes to the front-side of the die involves orienting the one or more positive electrodes on the die such that the second side of the die is opposite the first side of the die.

In some embodiments, after attaching the one or more positive electrodes to the die, the process next forms a plastic encapsulation to encapsulate the back electrode, the one or more positive electrodes, and the die. The plastic encapsulation also exposes both the end of the back electrode which extends beyond the first side of the die, and the ends of the one or more positive electrodes which extend beyond the second side of the die.

Note that by attaching both the plate-like back electrode and the plate-like positive electrodes on the surfaces of the die, and directly using the exposed ends of the plate-like electrodes as the lead-out electrodes for the chip assembly, the electrical connections outside of the die only occupy a very small volume. As a result, the proposed technique, while keeping the size of the die substantially the same, can significantly reduce the overall volume of the assembly, thereby enabling the packaging of small or ultra-small chips.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

We now describe detailed embodiments of the design and manufacture of an ultra-small chip assembly in conjunction with the supporting figures.

Figure 1:
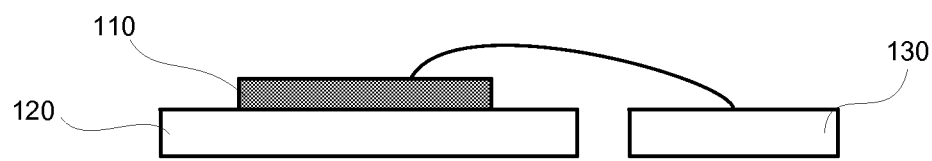
FIG. 1 presents a diagram illustrating an existing ultra-small "QFN" chip package.
Figure 2:
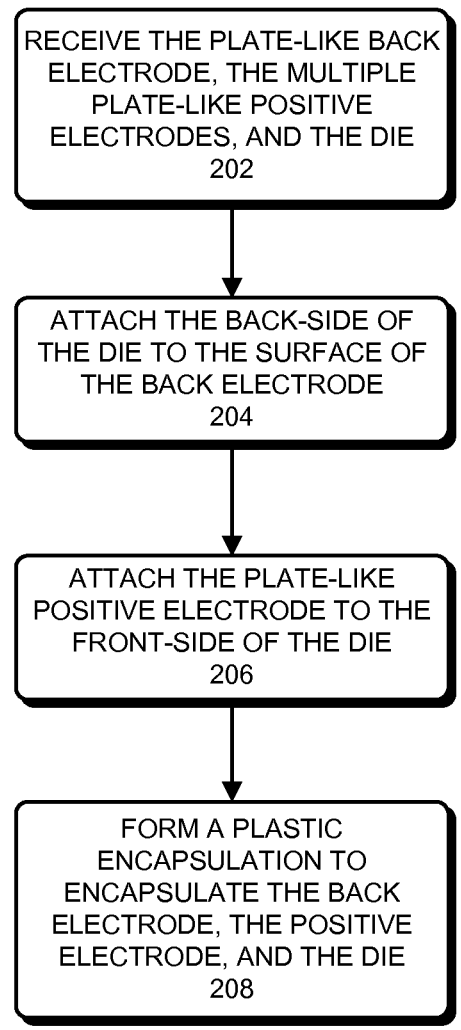
FIG. 2 presents a flowchart illustrating a process for manufacturing an ultra-small chip assembly in accordance with an embodiment.

FIG. 2 presents a flowchart illustrating a process for manufacturing an ultra-small chip assembly in accordance with an embodiment.

During operation, the process first receives a plate-like back electrode, multiple plate-like positive electrodes, and a die (step 202). The process then attaches the back-side of the die to the surface of the back electrode (step 204). In one embodiment, step 204 causes the back-side of the die to be electrically coupled to the surface of the back electrode. Next, the process attaches the plate-like positive electrode to the front-side of the die (step 206). In one embodiment, step 206 causes the positive electrodes to be electrically coupled to the surface of the die. The process then forms a plastic encapsulation to encapsulate the back electrode, the positive electrode, and the die (step 208).

Figure 3A:
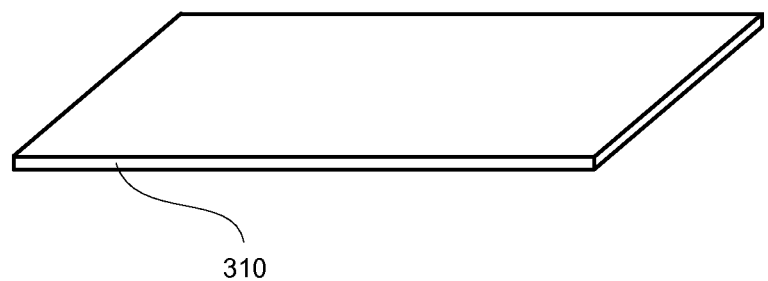
FIG. 3A illustrates a plate-like back electrode as described in step 202 in accordance with an embodiment.

FIGS. 3A-3E illustrate individual steps involved in the process flow described in FIG. 2 in accordance with an embodiment. More specifically, FIG. 3A illustrates a plate-like back electrode 310 as described in step 202 in accordance with an embodiment. In one embodiment, back electrode 310 can include any metallic material which is made into a plate structure.

Figure 3B:
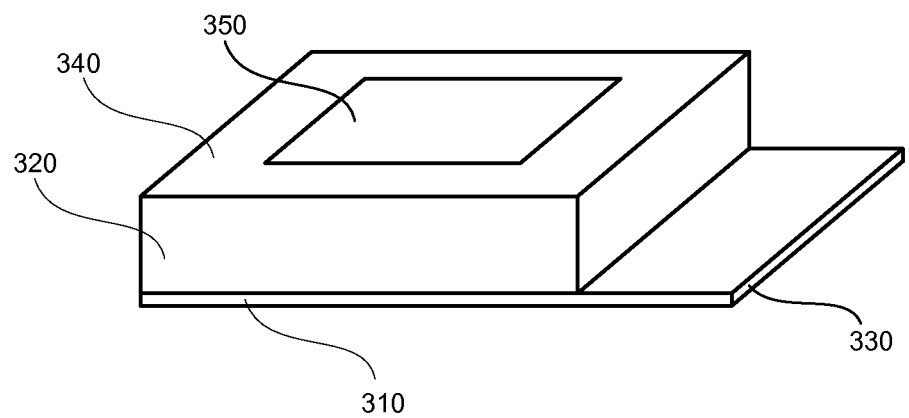
FIG. 3B illustrates the step of attaching the back-side of a die to the surface of the back electrode in accordance with an embodiment.

FIG. 3B, in reference to step 204, illustrates the step of attaching the back-side of a die 320 to the surface of back electrode 310 in accordance with an embodiment. In one embodiment, to ensure that the back-side of die 320 and back electrode 310 are electrically coupled, die 320 may be adhered to back electrode 310 by a soldering process using a conductive solder material. Alternatively, die 320 may be glued to back electrode 310 using a conductive adhesive. Note that the illustrated step 204 creates a protruding end 330 on back electrode 310 which extends beyond the boundary of die 320, wherein end 330 can be used to form an outside electrode in the finished chip assembly. Because die 320 is being packaged into an assembly, die 320 typically comprises pre-fabricated semiconductor devices. Hence, the front-side 340 of die 320 should be the same side where the pre-fabricated semiconductor devices are located. Note that the front-side 340 of die 320 also includes a bonding pad 350, wherein the back-side (not explicitly shown) of die 320 attached to back electrode 310 is opposite front-side 340 of die 320. In one embodiment, the back-side of die 320 can function as part of the back electrode.

Figure 3C:
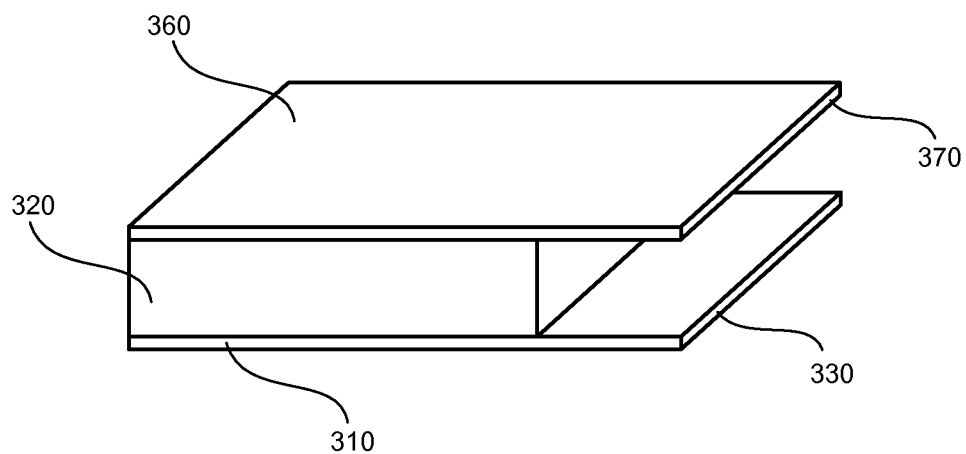
FIG. 3C illustrates the step of attaching a positive electrode to the front-side of the die in accordance with an embodiment.

FIG. 3C, in reference to step 206, illustrates the step of attaching a positive electrode 360 to the front-side 340 of die 320 in accordance with an embodiment. In this embodiment, because front-side 340 of die 320 includes a single bonding pad 350, the step ensures that the positive electrode 360 is electrically coupled to bonding pad 350. For example, positive electrode 360 may be attached to bonding pad 350 by soldering with a conductive solder material, or it may be glued to bonding pad 350 using a conductive adhesive, among other attachment techniques. Note that positive electrode 360 also includes a protruding end 370 which extends beyond the boundary of die 320, wherein protruding end 370 can be used to form an outside electrode in the finished chip assembly. In the embodiment shown, the protruding end 330 of back electrode 310 and the protruding end 370 of positive electrode 360 are on the same side of die 320.

Figure 3D:
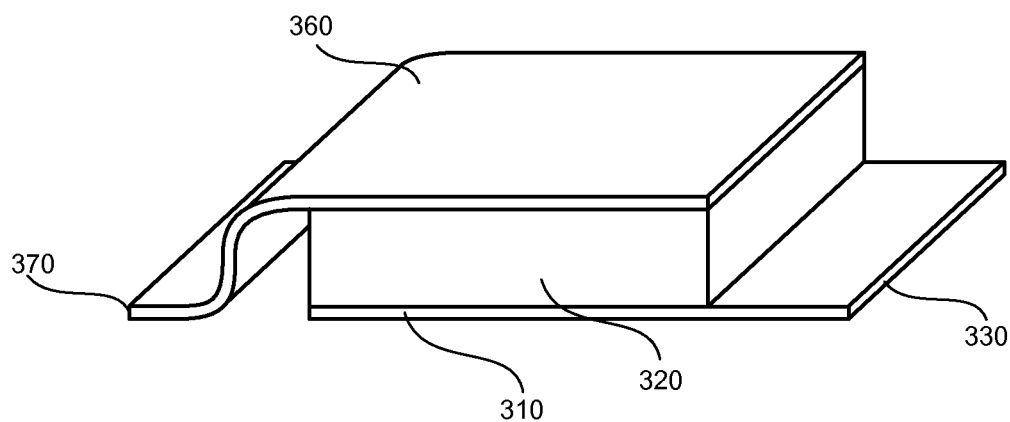
FIG. 3D illustrates an alternative execution and completion of the step of attaching the positive electrode to the front-side of the die in accordance with an embodiment.

FIG. 3D illustrates an alternative execution and completion of step 206 of attaching positive electrode 360 to the front-side 340 of die 320 in accordance with an embodiment. As illustrated in FIG. 3D, protruding end 330 of back electrode 310 is positioned to a first side of die 320, while protruding end 370 of positive electrode 360 is positioned to a second side of die 320 which is opposite the first side of die 320. Note that while the embodiments of FIGS. 3C and 3D illustrate die 320 in a typically rectangular shape, in other embodiments die 320 may be made into other non-rectangular shapes. In these embodiments, someone of ordinary skill in the art may reconfigure the relative positions of the respective protruding ends of the positive electrode and back electrode on die 320 based on the general techniques described in conjunction with FIGS. 3C and 3D.

In some embodiments, if the front-side of die 320 includes multiple bonding pads, multiple plate-like positive electrodes may be provided and attached to the front-side of die 320, so that each of the multiple positive electrodes is electrically coupled to a corresponding bonding pad among the multiple bonding pads in accordance with a predetermined design configuration, and each of the multiple positive electrodes includes an end extending beyond the boundary of die 320.

As can be seen from FIGS. 3C and 3D, plate-like back electrode 310 and plate-like positive electrode 360 essentially form an enclosed structure from both the front-side and the back-side of die 320. Within this structure, because the two electrodes are both attached to the surfaces of die 320, die 320 makes up the majority of the volume of the structure. As a result, while keeping a constant size of die 320, the proposed technique can significantly reduce the overall volume of the assembly, thereby enabling the packaging of small or ultra-small chips.

Figure 3E:
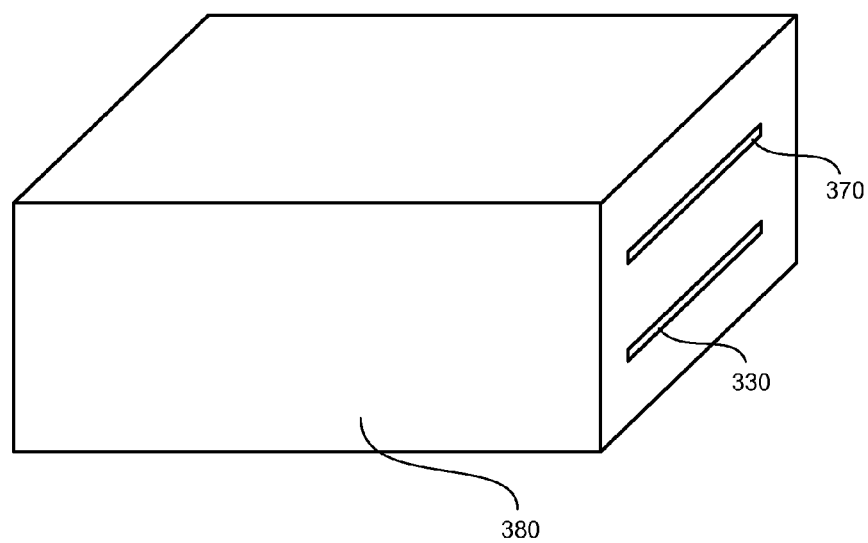
FIG. 3E illustrates the step of forming a plastic encapsulation in accordance with an embodiment.

FIG. 3E, in reference to step 208, illustrates the step of forming a plastic encapsulation 380 in accordance with an embodiment. In this embodiment, plastic encapsulation 380 encapsulates die 320, back electrode 310 and positive electrode 360, while exposing both the protruding end 330 of back electrode 310 and the protruding end 370 of positive electrode 360. Note that step 208 may be optional. This is because the structures illustrated in FIGS. 3C and 3D have essentially formed enclosures from both the front-side and the back-side of die 320; hence, such structures can be directly used in PCB and other applications. However, by performing step 208 to form plastic encapsulation 380, the process forms an encapsulated assembly which offers even greater capability to withstand external interference.

Figure 4:
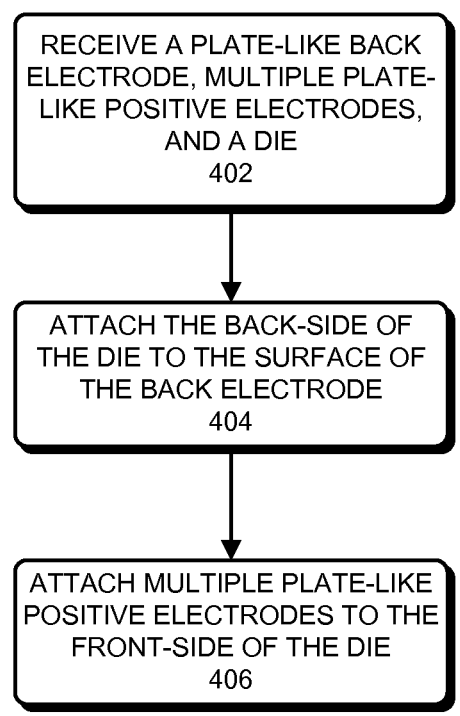
FIG. 4 presents a flowchart illustrating another process for manufacturing an ultra-small chip assembly in accordance with an embodiment.

FIG. 4 presents a flowchart illustrating another process for manufacturing an ultra-small chip assembly in accordance with an embodiment.

During operation, the process first receives a plate-like back electrode, multiple plate-like positive electrodes, and a die (step 402). In one embodiment, the die may have multiple bonding pads on its front surface. The process then attaches the back-side of the die to the surface of the back electrode (step 404). In one embodiment, step 404 causes the back-side of the die to be electrically coupled to the surface of the back electrode. Next, the process attaches multiple plate-like positive electrodes to the front-side of the die (step 406). Note that steps 402 and 404 may be substantially the same as steps 202 and 204 described above. However, some embodiments of step 406 are specifically used to accommodate cases where the die includes multiple bonding pads on the front surface, and requires leading out two or more electrodes from these bonding pads. For example, one embodiment of step 406 attaches two plate-like positive electrodes to the front surface of the die. To describe step 406 in more detail, FIGS. 5A-5B illustrate the manufacturing process involved in attaching two plate-like positive electrodes to the front surface of the die in accordance with an embodiment.

Figure 5A:
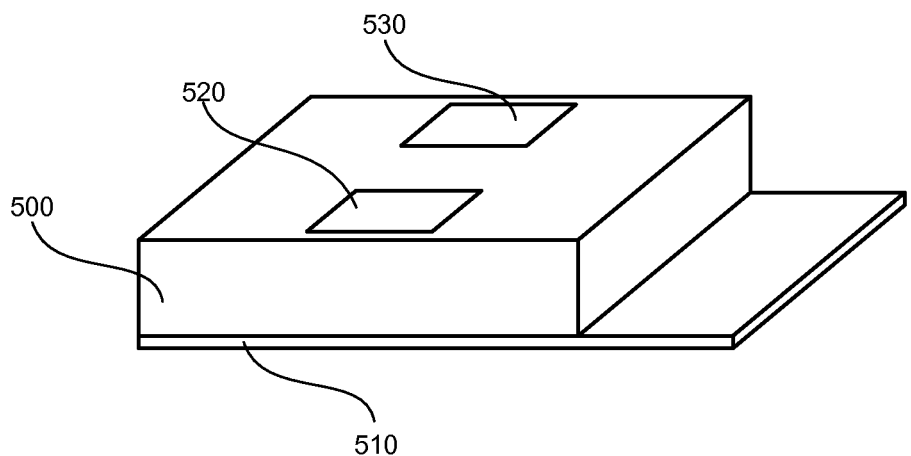
FIG. 5A illustrates a partially finished assembly after attaching the back-side of the die to the surface of the back electrode in accordance with an embodiment.

Specifically, FIG. 5A illustrates a partially finished assembly after attaching the back-side of the die to the surface of the back electrode in accordance with an embodiment. As illustrated in FIG. 5A, the structure includes a die 500, a plate-like back electrode 510, and two bonding pads 520 and 530 on the front surface of die 500. Moreover, FIG. 5B illustrates a finished assembly after performing step 406 in accordance with an embodiment. As illustrated in FIG. 5B, two plate-like positive electrodes 540 and 550 are attached to the front-side of die 500. Moreover, the protruding end 560 of plate-like back electrode 510 and the two protruding ends 570 and 580 of plate-like positive electrodes 540 and 550 are all on the same side of die 500. The three protruding ends 560-580 may be used as the electrodes for electrically connecting die 500 encapsulated in the assembly with external circuits.

Figure 5B:
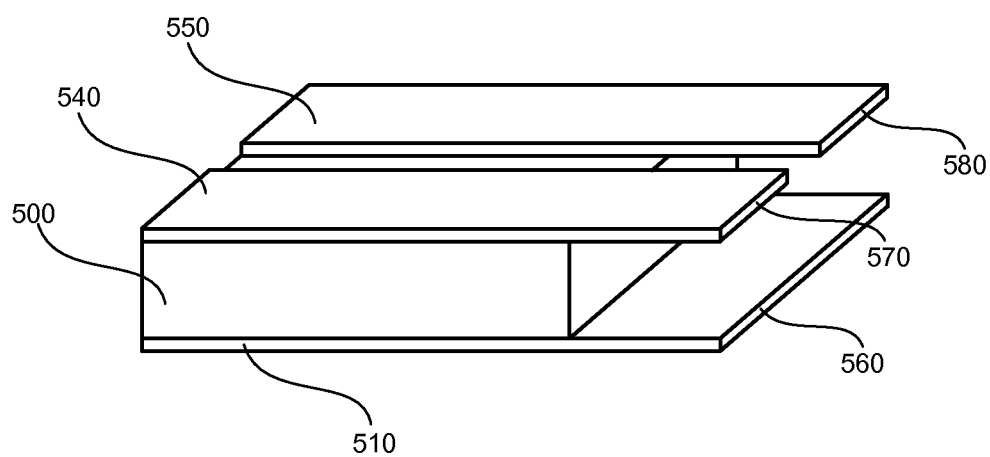
FIG. 5B illustrates a finished assembly after attaching the multiple plate-like positive electrodes to the front-side of the die in accordance with an embodiment.

Similarly to the previously described embodiments in conjunction with FIG. 3E, the structure illustrated in FIG. 5B can be directly used in PCB and other applications, or it can be subjected to a plastic encapsulation process to further improve its reliability.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A semiconductor device, comprising
   a semiconductor die with a front side, a back side, and edges;
   a conductive mounting platform attached to the back side of the die and extending over an edge of the die;
   a clip attached to the front side of the die and extending over the edge of the die;
   a plastic body with edges encapsulating the semiconductor die and a portion of the conductive mounting platform and a portion of the clip,
   a portion of the extended mounting platform and a portion of the extended clip exposed from an edge of the plastic body, and
   in which the clip including a portion that is attached to the die and is coplanar to the portion of the clip that extends over the edge of die.

2. The semiconductor device of claim 1, in which a portion of exposed mounting platform and a portion of exposed clip are coplanar.

3. The semiconductor device of claim 2, in which the coplanar portion of the exposed mounting platform and the coplanar portion of the exposed clip are coplanar with the edge of the plastic body.

4. The semiconductor device of claim 1, in which the clip includes multiple electrodes.

5. The semiconductor device of claim 4, in which each of the electrodes extends over the edge of the die and partially exposed from the plastic body.

6. The semiconductor device of claim 4, in which each of the electrodes includes a portion that is attached to the die and is coplanar to the portion of the electrode that extends over the edge of die.

7. The semiconductor device of claim 5, in which an exposed portion of the mounting platform is coplanar to an exposed portion of each electrode.

8. The semiconductor device of claim 2, in which the coplanar portion of the exposed portion of the mounting platform and the coplanar portion of the exposed portion of the electrode are coplanar with the edge of the plastic body.

9. A semiconductor device, comprising:
   a semiconductor die with a front side, a back side, and edges;
   a plate-like flat clip of multiple electrodes attached to the front side of the die and extending over the edge of the die; and
   a plastic body with edges encapsulating the semiconductor die and portions of the clip and exposing end portions of the clip at an edge of the plastic body.

10. The semiconductor device of claim 9, in which the exposed end portions of the clip are coplanar.

* * * * *